(12) United States Patent
Purden et al.

(10) Patent No.: US 11,145,961 B2
(45) Date of Patent: *Oct. 12, 2021

(54) VEHICLE RADAR SIGNALING DEVICE INCLUDING A SUBSTRATE INTEGRATED WAVEGUIDE

(71) Applicant: APTIV TECHNOLOGIES LIMITED, St. Michael (BB)

(72) Inventors: George J. Purden, Atascadero, CA (US); Shawn Shi, Thousand Oaks, CA (US)

(73) Assignee: APTIV TECHNOLOGIES LIMITED, St. Michael (BB)

( * ) Notice: Subject to any disclaimer, the term of this patent is extended or adjusted under 35 U.S.C. 154(b) by 0 days.

This patent is subject to a terminal disclaimer.

(21) Appl. No.: 16/671,247

(22) Filed: Nov. 1, 2019

(65) Prior Publication Data

US 2020/0067166 A1    Feb. 27, 2020

Related U.S. Application Data

(63) Continuation of application No. 15/070,059, filed on Mar. 15, 2016, now Pat. No. 10,468,738.

(51) Int. Cl.
| | |
|---|---|
| *H01Q 1/32* | (2006.01) |
| *H01P 5/103* | (2006.01) |
| *H01P 11/00* | (2006.01) |
| *H01L 23/00* | (2006.01) |
| *H01L 23/66* | (2006.01) |
| *H01P 3/12* | (2006.01) |
| *H01Q 1/22* | (2006.01) |
| *H01P 5/107* | (2006.01) |

(Continued)

(52) U.S. Cl.
CPC ........... *H01Q 1/3233* (2013.01); *H01L 23/66* (2013.01); *H01L 24/10* (2013.01); *H01P 3/121* (2013.01); *H01P 5/103* (2013.01); *H01P 5/107* (2013.01); *H01P 11/001* (2013.01); *H01Q 1/2283* (2013.01); *H01Q 1/50* (2013.01); *H01Q 3/34* (2013.01); *H01L 2223/6616* (2013.01); *H01L 2223/6677* (2013.01); *H01L 2224/16225* (2013.01)

(58) Field of Classification Search
CPC .......... H01P 3/121; H01P 5/103; H01P 5/107; H01P 11/001; H01Q 1/3233
USPC .................................................. 333/248, 26
See application file for complete search history.

(56) References Cited

U.S. PATENT DOCUMENTS

| | | | |
|---|---|---|---|
| 7,439,822 B2 | 10/2008 | Shimura et al. | |
| 8,552,815 B2 | 10/2013 | Fujii et al. | |
| 10,199,707 B2 * | 2/2019 | Purden et al. | ............ H01P 5/08 |

(Continued)

FOREIGN PATENT DOCUMENTS

| | | |
|---|---|---|
| FR | 2 462 787 A1 | 2/1981 |
| GB | 2 499 792 A | 9/2013 |

*Primary Examiner* — Benny T Lee
(74) *Attorney, Agent, or Firm* — Carlson, Gaskey & Olds

(57) ABSTRACT

An illustrative example electronic device includes a substrate integrated wave guide (SIW) comprising a substrate and a plurality of conductive members in the substrate. An antenna member is situated at least partially in the substrate in a vicinity of at least some of the plurality of conductive members. A signal generator has a conductive output electrically coupled with the antenna member. The antenna member radiates a signal into the SIW based on operation of the signal generator.

7 Claims, 3 Drawing Sheets

(51) Int. Cl.
    *H01Q 1/50*     (2006.01)
    *H01Q 3/34*     (2006.01)

(56) References Cited

U.S. PATENT DOCUMENTS

| | | | |
|---|---|---|---|
| 10,468,738 B2 * | 11/2019 | Purden et al. | H01P 3/121 |
| 2002/0000933 A1 | 1/2002 | Kitamori et al. | |
| 2011/0140801 A1 | 6/2011 | Shimura et al. | |
| 2011/0165847 A1 | 7/2011 | Kawasaki | |
| 2012/0206219 A1 | 8/2012 | Choi et al. | |
| 2013/0154759 A1 | 6/2013 | Morita et al. | |
| 2015/0048471 A1 * | 2/2015 | Hasch et al. | H01P 5/107 |
| | | | 257/433 |
| 2015/0364804 A1 | 12/2015 | Tong et al. | |
| 2016/0197630 A1 | 7/2016 | Kawasaki | |

* cited by examiner

VEHICLE RADAR SIGNALING DEVICE INCLUDING A SUBSTRATE INTEGRATED WAVEGUIDE

CROSS-REFERENCE TO RELATED APPLICATIONS

This application is a continuation of U.S. patent application Ser. No. 15/070,059, which was filed on Mar. 15, 2016, now U.S. Pat. No. 10,468,738.

BACKGROUND

Modern day passenger vehicles include an increasing amount of electronics. Advances in technology have made it possible to incorporate a wide variety of systems onto a vehicle. For example, various sensor configurations have been developed to provide assistance or information to a driver regarding the environment surrounding the vehicle. Various object detection and sensing technologies provide parking assist and collision avoidance features, for example.

Advances in radio frequency signaling technology have enabled the development of sophisticated system-on-a-chip integrated circuits. The functionality required for environmental sensing or communications can be embodied in integrated circuit components. Example uses for such devices include automotive vehicle radar detection systems, robotics guiding systems and Wi-Fi data transfer.

Antennas for signal transmission may vary depending on the particular sensing or communication of interest. For example, low gain, broadband antennas are used for Wi-Fi communications and larger, high gain antennas are typically used for point-to-point data communications. Antennas useful for automotive radar systems typically fall between those two extremes. One type of antenna that has been developed that can be useful for vehicle-based systems is known as a substrate-integrated-wave guide (SIW). These devices are useful in the vehicle context because they typically possess high efficiency and are relatively low cost.

One challenge associated with utilizing SIWs for a vehicle-based sensing or communication system is associated with the connection between the integrated circuit components and the SIW. For example, microstrip or coplanar wave guide microwave transmission lines can provide an interface between the integrated circuit components and the SIW. Such connections include drawbacks, such as the requirement for a microwave component that matches the field configuration peculiar to each transmission line. The transition associated with such a microwave component increases microwave loss and introduces microwave reflections that may limit bandwidth and impact the ability to produce such systems. When a microstrip is used, bandwidth may be limited by the requirement for the ground connection to pass from the integrated circuit component connectors through the SIW substrate to a metal layer on that substrate. Such connections are typically made using a relatively expensive blind via process.

BRIEF SUMMARY OF THE INVENTION

An illustrative example electronic device includes a substrate integrated wave guide (SIW) comprising a substrate and a plurality of conductive members in the substrate. An antenna member is situated at least partially in the substrate in a vicinity of at least some of the plurality of conductive members. A signal generator has a conductive output electrically coupled with the antenna member. The antenna member radiates a signal into the SIW based on operation of the signal generator.

An illustrative example method of making an electronic device includes placing an antenna member in a substrate. The substrate includes a plurality of conductive members. The substrate and the plurality of conductive members establish a substrate integrated wave guide (SIW). The antenna member is in a vicinity of at least some of the conductive members. A signal generator is placed adjacent the surface of the substrate near the antenna member. The signal generator has an output comprising at least one solder ball received adjacent the surface of the substrate. An electrically conductive connection between the solder ball and the antenna member is established and the antenna member radiates a signal into the SIW based on operation of the signal generator.

An illustrative example method of operating a transmitter including a substrate integrated wave guide (SIW) having a substrate and a plurality of conductive members in the substrate, an antenna member situated at least partially in the substrate in a vicinity of at least some of the plurality of conductive members, and a signal generator having a conductive output electrically coupled with the antenna member includes radiating a signal from the antenna member into the SIW. The radiated signal is based on operation of the signal generator. The signal is transmitted from the SIW.

The various features and advantages of at least one disclosed example embodiment will become apparent to those skilled in the art from the following detailed description. The drawings that accompany the detailed description can be briefly described as follows.

DETAILED DESCRIPTION OF THE INVENTION

Embodiments of this invention provide a signaling device having a unique connection between a signal generator output and a substrate-integrated-waveguide (SIW). Embodiments of this invention eliminate interconnecting transitions between the signal generator and the SIW, which maximizes system performance while minimizing complexity.

Figure 1:
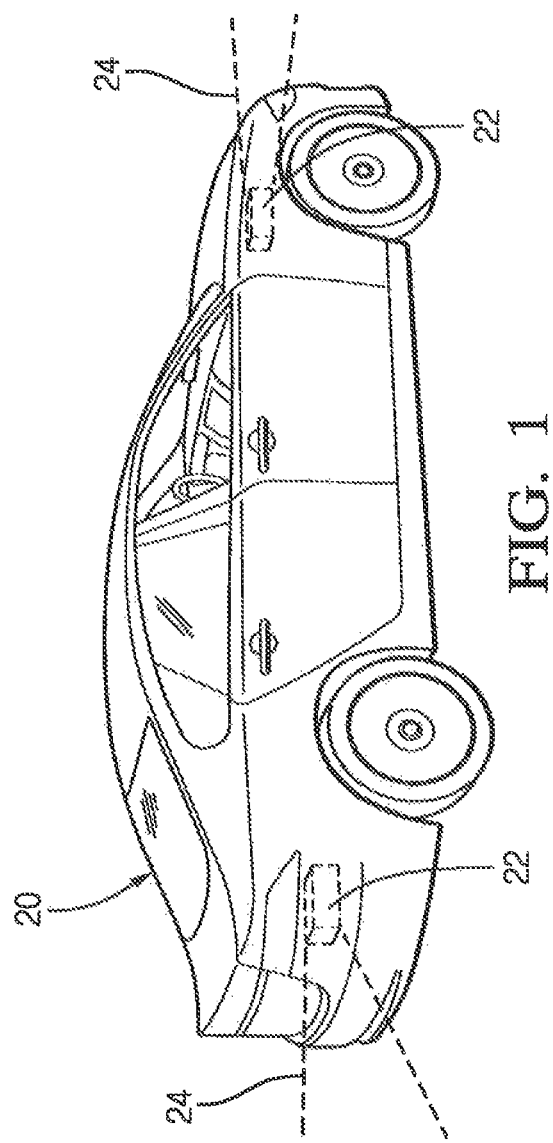
FIG. 1 diagrammatically illustrates a vehicle including a signaling device designed according to an embodiment of this invention.

FIG. 1 illustrates a vehicle 20 including a plurality of signaling devices schematically shown at 22. In some examples, the signaling devices 22 are configured as radar signaling devices useful for detecting objects in a vicinity of the vehicle 20 based on signals schematically shown at 24 transmitted by the devices 22. The example signaling devices 22 may be useful for parking assistance, collision avoidance and other object detection features on a passenger vehicle.

Figure 2:
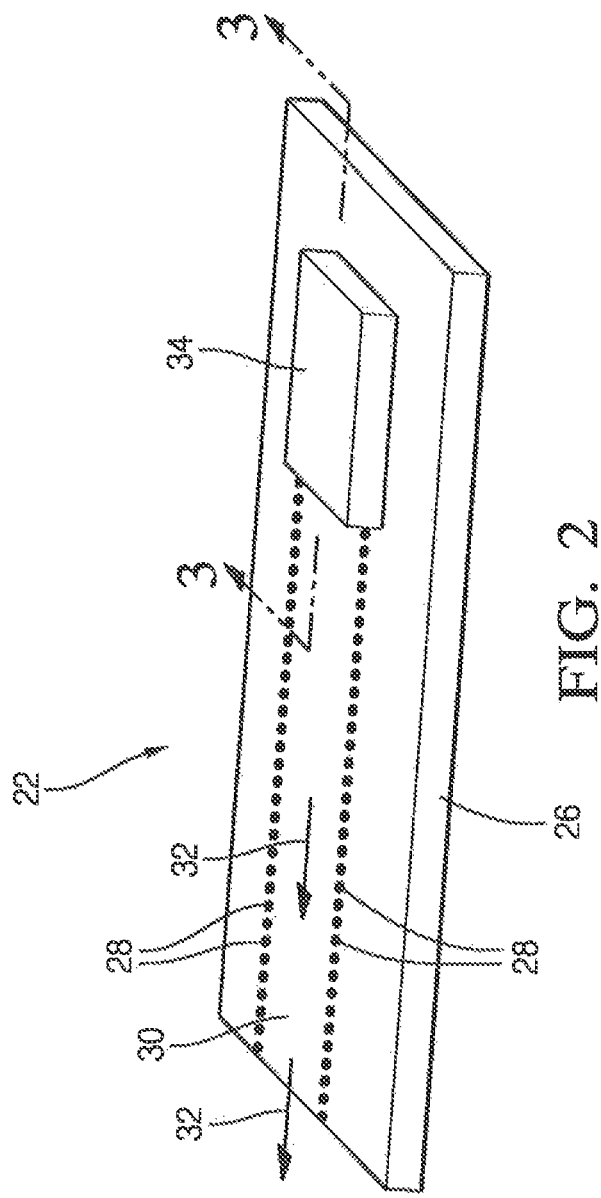
FIG. 2 diagrammatically illustrates a signaling device designed according to an embodiment of this invention.
Figure 3:
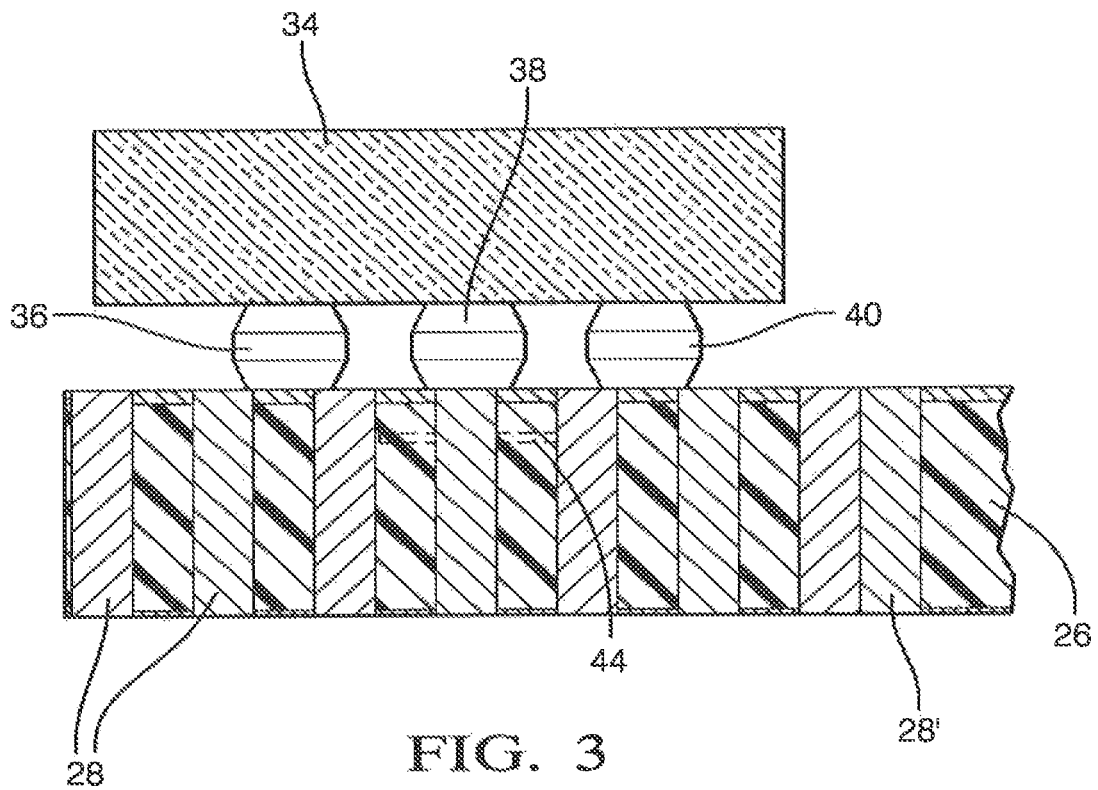
FIG. 3 is a sectional illustration taken along the lines 3-3 in FIG. 2.

Referring to FIGS. 2 and 3, which show one of the signalling devices 22, a substrate 26 comprises a known integrated circuit substrate material. A variety of dielectric materials are suitable as the substrate 26. A plurality of conductive members 28 are situated in the substrate 26 to establish a SIW 30, which is useful, for example, as a microwave antenna. The SIW 30 in this example has a direction of signal transmission represented by the arrows 32. In one example, the conductive members 28 comprise metalized vias in the substrate 26. In another example, the conductive members 28 comprise metal filled vias in the substrate 26.

A signal generator component 34 is supported on the substrate 26. In this example, the signal generator component 34 includes an integrated circuit configured in a known manner for generating a desired type of signal. In this example, the signal generator component 34 includes all of the functions necessary for radio based signaling that may be useful for sensing or communication, for example. In one example embodiment, the signal generator component 34 is configured for radar detection signal transmission.

The signal generator component 34 in this example includes a ball grid array that is useful for establishing a connection with a metal layer, for example, on the substrate 26. FIG. 3 illustrates three of the solder balls of the ball grid array at 36, 38 and 40. In this example, the solder ball 38 provides a direct connection between the signal generator component 34 and an antenna member 44 that is situated at least partially in the substrate 26.

Figure 4:
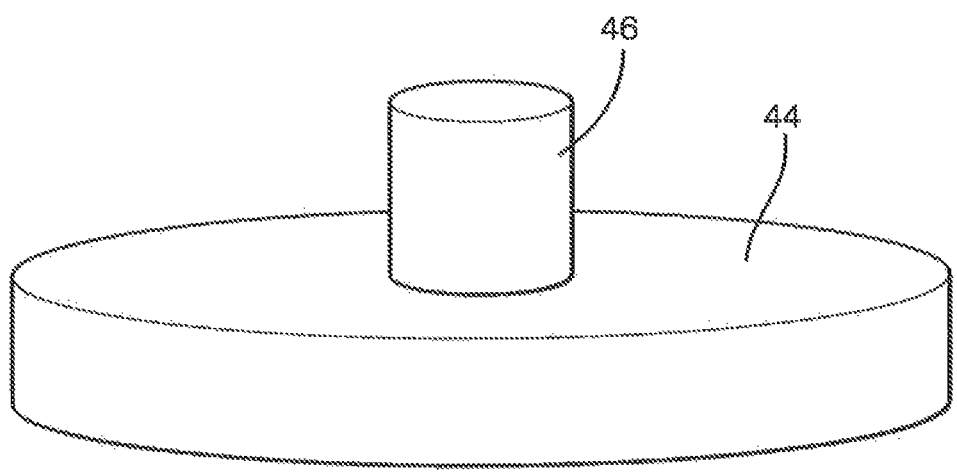
FIG. 4 diagrammatically illustrates an example antenna member.

As shown in FIG. 4, the antenna member 44 of this example includes a generally flat, generally circular plate of conductive material, such as metal. In some examples, the antenna member 44 comprises a copper disk printed on a metal layer supported on the substrate 26 (FIG. 2). In the illustrated example, a via 46 provides a connection to the antenna member 44. The dimensions of the via 46 and the antenna member 44 establish the resonant frequency of the antenna element.

Figure 5:
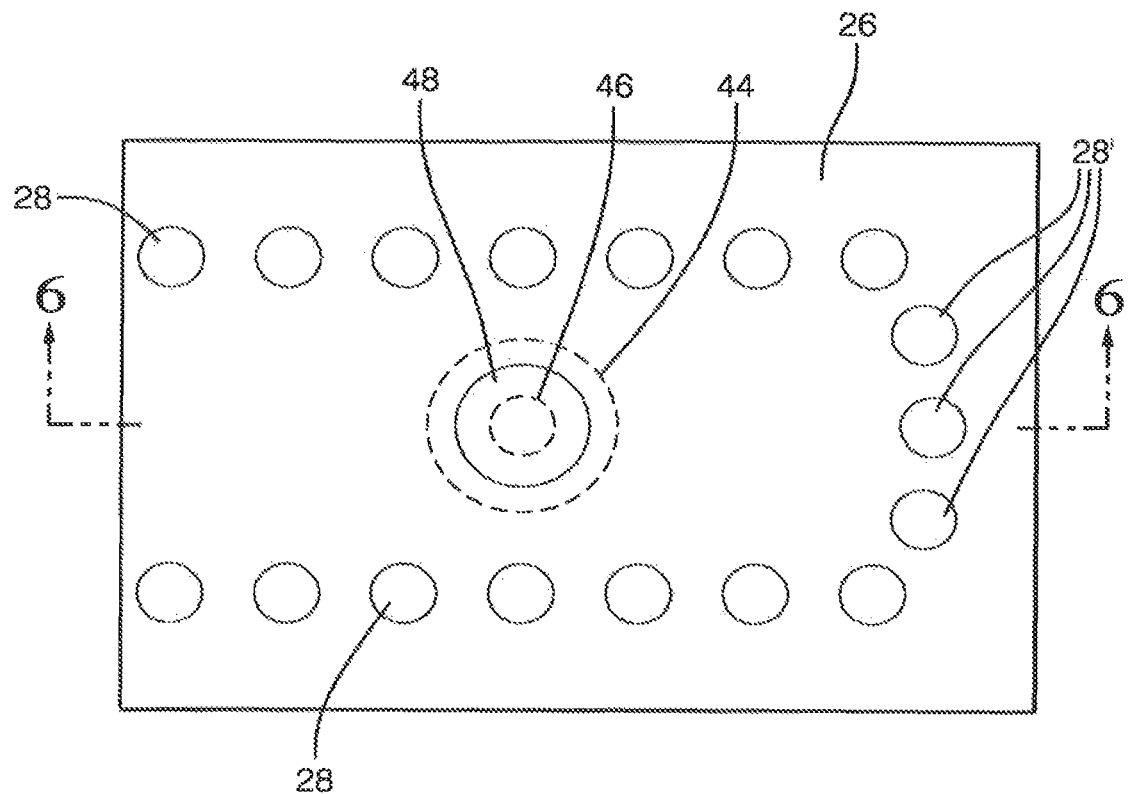
FIG. 5 schematically illustrates selected portions of the example device shown in FIGS. 2 and 3.
Figure 6:
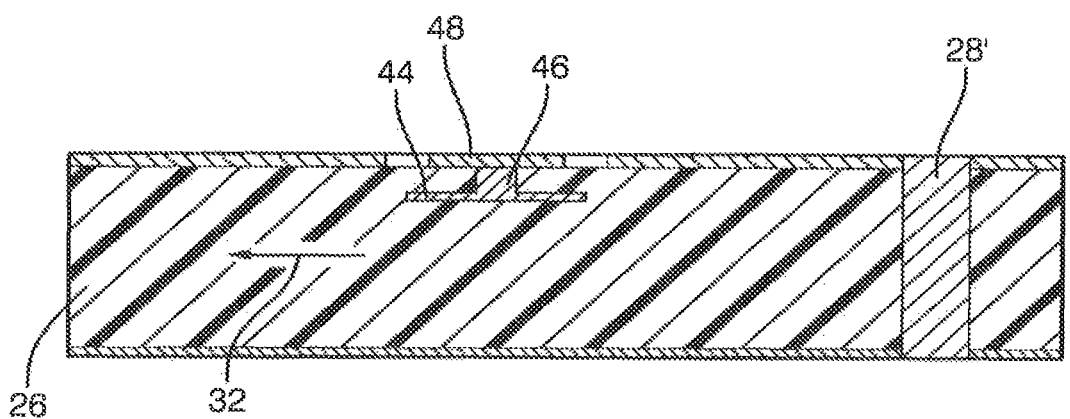
FIG. 6 is a cross-sectional view taken along the lines 6-6 in FIG. 5.

Referring to FIGS. 5 and 6, a solder pad 48 is supported on the substrate 26, for example on a metal layer on one surface of the substrate 26. The solder ball 38 (FIG. 3) is connected to the solder pad 48 during a reflow process used for mounting the signal generator component 34 (FIGS. 2 and 3) on the substrate 26. The solder ball 38 (FIG. 3), the solder pad 48 and the via 46 provide a direct connection between the antenna member 44 and the operative circuitry of the signal generator component 34 (FIGS. 2 and 3). Such a direct connection does not include or introduce microwave losses or microwave reflections, such as those that typically accompany connections to microstrips.

The antenna member 44 radiates a signal into the SIW 30 (FIG. 2) based on operation of the signal generator component 34. As best appreciated from FIG. 5, the antenna member 44 is spaced from the conductive members 28 of the SIW 00 in FIG. 2). There is at least some substrate material between the antenna member 44 and the conductive members 28. The dimensions of the antenna member 44 and its location relative to the conductive members 28 may be varied to meet different needs in different situations. For example, the desired transmission frequency and the substrate material have an impact on the desired relationship between the antenna member 44 and the conductive members 28. Given this description, those skilled in the art will be able to select appropriate dimensions and materials to meet their particular needs.

One feature of the illustrated example is a backshort established by a plurality of the conductive members 28' (FIGS. 3, 5 and 6). In the illustrated example, the three rightmost conductive members 28' (according to FIG. 5, for example) establish the backshort. Some of the conductive members 28 are situated on a first side of the antenna member 44. The direction of signal transmission represented at 32 is on the first side of the antenna member 44. RF signal energy radiated from the antenna member 44 toward the first side of the antenna member 44 travels in the signal transmission direction 32 (FIGS. 2 and 6). Some RF energy will be radiated from the antenna member 44 toward a second, different side of the antenna member, which is in an opposite direction from the direction of signal transmission shown at 32. The conductive members 28' of the backshort reflect such RF energy and direct it into or toward the direction of signal transmission 32. The dimensions of the area on the substrate 26 for establishing the backshort is determined based on the substrate material and the frequency of the signal transmitted by the device 22. The RF energy reflected by the backshort is preferably in phase with the radiated energy from the antenna member 44 already moving in the direction of signal transmission 32. The arrangement of the conductive members 28' on the substrate 26 needed to achieve a desired reflection of the radiated energy from the antenna member 44 for a particular implementation can be determined by those skilled in the art who have the benefit of this description.

The illustrated example signaling device 22 includes a direct connection of the ball grid array of the signal generator component 34 to the SIW 30. With the illustrated embodiment, there is no need for loss-introducing transmissions from the signal generator component to a planar wave guide and then from a planar wave guide to the SIW. It follows that the illustrated example signaling device is more effective and has potentially wider application than previous signaling device configurations.

In the illustrated example, the radiating structure of the antenna member 44 is achieved using standard planar printed circuit board technology such that no special processing is required. Additionally, no external components are needed. The illustrated example provides a lower cost solution compared to previous configurations.

The preceding description is exemplary rather than limiting in nature. Variations and modifications to the disclosed examples may become apparent to those skilled in the art that do not necessarily depart from the essence of this invention. The scope of legal protection given to this invention can only be determined by studying the following claims.

We claim:

1. A radar signalling device for detecting objects in a vicinity of a vehicle, the device, comprising:
    a substrate including a metal layer on at least one side of the substrate;
    a substrate integrated waveguide (SIW) comprising a portion of the substrate and a plurality of conductive members in the substrate;
    an antenna member situated at least partially in the substrate within the SIW in a vicinity of at least some of the plurality of conductive members;
    a radar detection signal generator component situated on the at least one side of the substrate, the radar detection signal generator component having a conductive output directly connected with the metal layer on the at least one side of the substrate; and a conductor within the substrate, the conductor being directly connected to the metal layer and the antenna member, wherein the antenna member comprises a portion of a metal layer in the substrate comprising a generally circular and generally planar disk, the antenna member radiates a radar detection signal into the SIW based on operation of the signal generator, and the SIW transmits the radar detection signal out of the SIW into the vicinity of the vehicle.

2. A radar signalling device for detecting objects in a vicinity of a vehicle, the device, comprising:

a substrate including a metal layer on at least one side of the substrate;

a substrate integrated waveguide (SIW) comprising a portion of the substrate and a plurality of conductive members in the substrate;

an antenna member situated at least partially in the substrate within the SIW in a vicinity of at least some of the plurality of conductive members;

a radar detection signal generator component situated on the at least one side of the substrate, the radar detection signal generator component having a conductive output directly connected with the metal layer on the at least one side of the substrate; and a conductor within the substrate, the conductor being directly connected to the metal layer and the antenna member, wherein the radar detection signal generator component comprises a ball grid array including a plurality of solder balls, the conductive output comprises at least one of the plurality of solder balls, the antenna member radiates a radar detection signal into the SIW based on operation of the signal generator, and the SIW transmits the radar detection signal out of the SIW into the vicinity of the vehicle.

3. The device of claim 2, wherein the metal layer includes a solder pad on the at least one side of the substrate, and the conductor comprises a via establishing an electrically conductive connection between the solder pad and the antenna member.

4. The device of claim 3, wherein at least some of a material of the at least one of the plurality of solder balls is reflowed to connect the solder pad to the radar detection signal generator component.

5. The device of claim 2, wherein the plurality of conductive members in the substrate of the SIW leave one side of the SIW open.

6. The device of claim 2, wherein a material of the substrate separates the antenna member from the at least some of the plurality of conductive members of the SIW.

7. The device of claim 2, wherein each of the plurality of conductive members of the SIW respectively comprise a metalized via or a metal-filled via in the substrate;

the SIW transmits the radar detection signal out of the SIW in a direction of signal output on a first side of the antenna element;

the SIW includes a plurality of backshort vias in the substrate on a second side of the antenna element;

at least some of the second side faces in an opposite direction from the direction of signal output; and the plurality of backshort vias reflect radiation from the antenna element in the direction of signal output.

* * * * *

UNITED STATES PATENT AND TRADEMARK OFFICE
CERTIFICATE OF CORRECTION

Page 1 of 1

PATENT NO. : 11,145,961 B2
APPLICATION NO. : 16/671247
DATED : October 12, 2021
INVENTOR(S) : George J. Purden and Shawn Shi It is certified that error appears in the above-identified patent and that said Letters Patent is hereby corrected as shown below:

In the Claims

In Claim 7, Column 6, Line 28; replace "antenna element" with --antenna member--

In Claim 7, Column 6, Line 30; replace "antenna element" with --antenna member--

In Claim 7, Column 6, Line 34; replace "antenna element" with --antenna member--

Signed and Sealed this
Twelfth Day of April, 2022

Drew Hirshfeld
*Performing the Functions and Duties of the*
*Under Secretary of Commerce for Intellectual Property and*
*Director of the United States Patent and Trademark Office*